United States Patent
Kim et al.

(10) Patent No.: US 11,215,506 B2
(45) Date of Patent: Jan. 4, 2022

(54) SUBSTRATE PROCESSING APPARATUS, SUBSTRATE PROCESSING MODULE, AND SEMICONDUCTOR DEVICE FABRICATION METHOD

(71) Applicant: SAMSUNG ELECTRONICS CO., LTD., Suwon-si (KR)

(72) Inventors: Kyeonghun Kim, Hwaseong-si (KR); Jeongil Mun, Hwaseong-si (KR); Hyung Joo Lee, Hwaseong-si (KR); Jongwoo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/162,665

(22) Filed: Jan. 29, 2021

(65) Prior Publication Data

US 2021/0148760 A1    May 20, 2021

Related U.S. Application Data

(63) Continuation of application No. 16/536,944, filed on Aug. 9, 2019, now Pat. No. 10,935,429.

(30) Foreign Application Priority Data

Dec. 27, 2018 (KR) .......................... 10-2018-0170925

(51) Int. Cl.
*G01J 3/443* (2006.01)
*H01J 37/32* (2006.01)
*G01J 3/28* (2006.01)

(52) U.S. Cl.
CPC ......... *G01J 3/443* (2013.01); *H01J 37/32972* (2013.01); *H01J 37/32981* (2013.01); *G01J 2003/2866* (2013.01)

(58) Field of Classification Search
CPC .. G01J 3/443; G01J 2003/2866; G01J 3/0202; G01J 3/0218; G01J 3/0291;
(Continued)

(56) References Cited

U.S. PATENT DOCUMENTS 5,759,424 A    6/1998 Imatake et al.
5,844,683 A    12/1998 Pavloski et al.
(Continued)

FOREIGN PATENT DOCUMENTS

KR    10-2013-0064472 A    6/2013
KR    10-1279911 B1    6/2013

OTHER PUBLICATIONS

Notice of Allowance issued in parent U.S. Appl. No. 16/536,944 dated Dec. 28, 2020.

*Primary Examiner* — Abdullahi Nur
(74) *Attorney, Agent, or Firm* — Sughrue Mion, PLLC

(57) ABSTRACT

A substrate processing module includes a process chamber configured to perform a treatment process on a substrate; a transfer chamber provided on a first side of the process chamber, the substrate being transferred between the process chamber and the transfer chamber; an optical emission spectroscopy (OES) system provided on a second side of the process chamber and configured to monitor the process chamber; and a reference light source disposed in the transfer chamber and configured to emit a reference light to calibrate the OES system.

5 Claims, 13 Drawing Sheets

(58) Field of Classification Search
CPC ...... G01J 3/28; G01J 21/30; G01J 3/30; H01J 37/32981; H01J 37/32972; H01L 21/6719; H01L 21/681
See application file for complete search history.

(56) References Cited

U.S. PATENT DOCUMENTS

| | | |
|---|---|---|
| 6,246,473 B1 | 6/2001 | Smith, Jr. et al. |
| 6,368,975 B1 | 4/2002 | Balasubramhanya et al. |
| 6,830,939 B2 | 12/2004 | Harvey et al. |
| 8,125,633 B2 | 2/2012 | Whelan et al. |
| 10,008,370 B2 | 6/2018 | Ohmori et al. |
| 2011/0200247 A1* | 8/2011 | Ravid ................... G06T 5/006 382/144 |
| 2018/0136118 A1 | 5/2018 | Kueny et al. |

\* cited by examiner

SUBSTRATE PROCESSING APPARATUS, SUBSTRATE PROCESSING MODULE, AND SEMICONDUCTOR DEVICE FABRICATION METHOD

CROSS-REFERENCE TO RELATED APPLICATION

This application is a continuation of U.S. application Ser. No. 16/536,944 filed Aug. 9, 2019, which claims priority under 35 U.S.C § 119 to Korean Patent Application No. 10-2018-0170925 filed on Dec. 27, 2018 in the Korean Intellectual Property Office, the disclosures of which are hereby incorporated by reference in their entirety.

BACKGROUND

Apparatuses and methods consistent with example embodiments relate to a substrate processing apparatus, a substrate processing module, and a method of fabricating a semiconductor device, and more particularly, to a substrate processing apparatus including optical emission spectroscopy (OES) systems, a substrate processing module including OES systems, and a semiconductor device fabrication method using OES systems.

In terms of the miniaturization and the advancement of processes for manufacturing semiconductor devices and flat panel display devices, plasma substrate processing apparatuses are being used for performing, for example, an etching process, a chemical vapor deposition process, and the like. A plasma substrate processing apparatus is configured to supply a stage or electrode with radio-frequency energy to produce electric fields or magnetic fields within a plasma processing chamber and to generate plasma by electromagnetic fields to process a substrate.

SUMMARY

One or more example embodiments provide a substrate processing apparatus, a substrate processing module, and a semiconductor device fabrication method with improved reliability.

According to an aspect of an example embodiment, there is provided a substrate processing module including: a process chamber configured to perform a treatment process on a substrate; a transfer chamber provided on a first side of the process chamber, the substrate being transferred between the process chamber and the transfer chamber; an optical emission spectroscopy (OES) system provided on a second side of the process chamber and configured to monitor the process chamber; and a reference light source disposed in the transfer chamber and configured to emit a reference light to calibrate the OES system.

According to an aspect to another example embodiment, there is provided a substrate processing apparatus including: a chamber configured to accommodate a substrate therein; a transfer robot provided in the chamber and configured to transfer the substrate from the chamber to an exterior of the chamber; and a reference light source provided in the chamber and configured to emit a reference light to monitor the exterior of the chamber.

According to an aspect of another example embodiment, there is a semiconductor device fabrication method including calibrating an optical emission spectroscopy (OES) system provided on a process chamber, the calibrating the OES system by radiating a plurality of reference lights having different wavelength spectra from a reference light source onto the OES system; providing a substrate into the process chamber; and performing a plasma process on the substrate in the process chamber.

BRIEF DESCRIPTION OF THE DRAWINGS

The above and/or other aspects, features, and advantages of the disclosure will be more clearly understood from the following detailed description, taken in conjunction with the accompanying drawings, in which.

DETAILED DESCRIPTION

Example embodiments will be described in detail with reference to the accompanying drawings.

Figure 1:
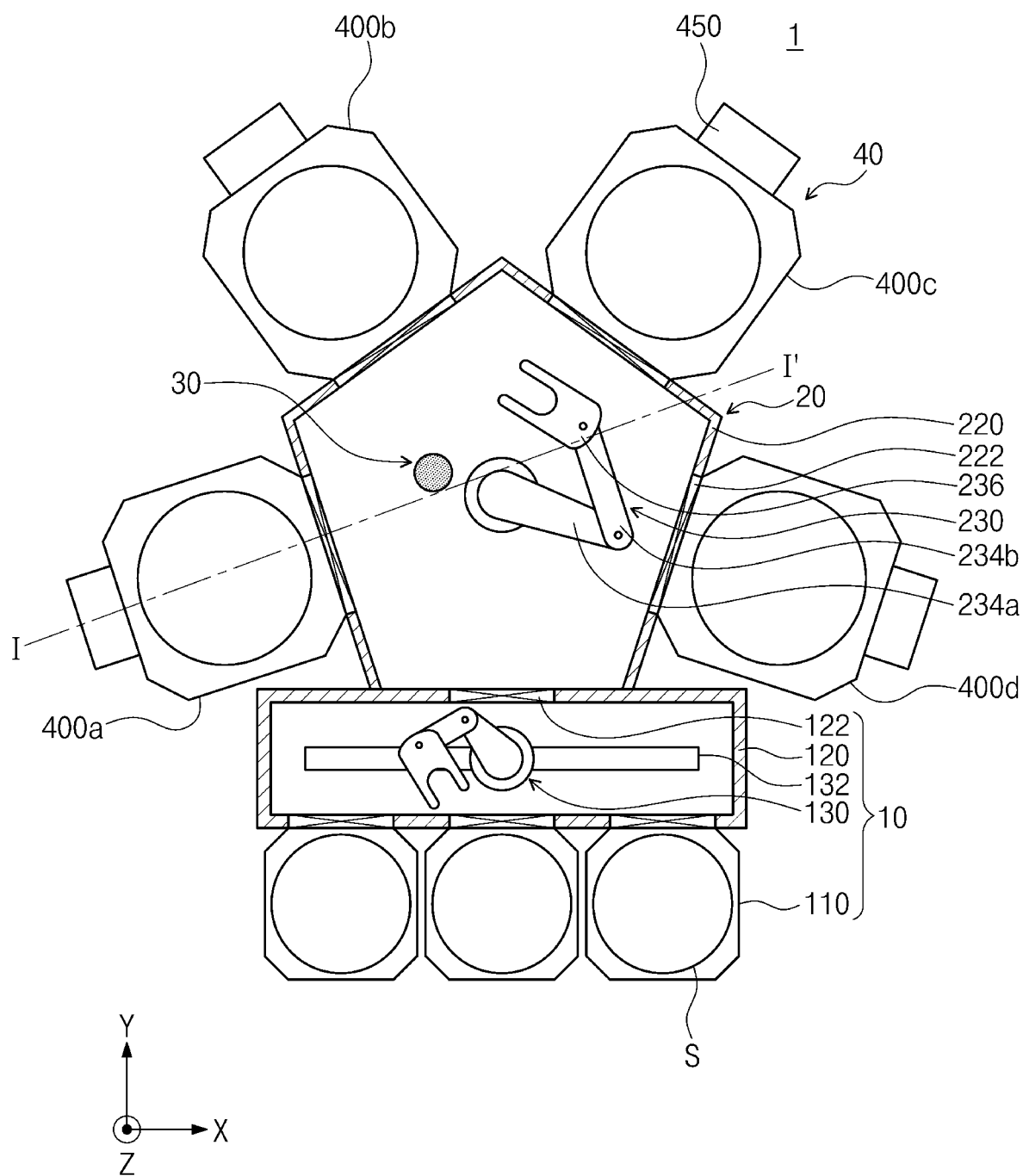
FIG. 1 illustrates a simplified plan view of a substrate processing module according to an example embodiment.

FIG. 1 illustrates a simplified plan view of a substrate processing module 1 according to an example embodiment. The substrate processing module 1 may perform a plasma process on a substrate S. In the example embodiment, the substrate S may represent various kinds of semiconductor substrates, such as wafers, for fabricating a semiconductor device.

Referring to FIG. 1, the substrate processing module 1 may include an equipment front end module (EFEM) 10, a transfer chamber 20, a reference light source 30, a processing section 40, and a controller. The EFEM 10 and the transfer chamber 20 may be arranged in one direction (e.g., a Y direction). In the example embodiment, the Y direction is defined to indicate a direction along which the EFEM 10 and the transfer chamber 20 are arranged with each other, an X direction is defined to indicate a direction perpendicular to the Y direction in plan view, and a Z direction is defined to indicate a direction perpendicular to both the X and Y directions.

The EFEM 10 may have load ports 110 and a transfer frame 120. Along the Y direction, the load ports 110 may be disposed on a front end of the EFEM 10. The load ports 110 may be linearly arranged along the X direction from one another, and each of the load ports 110 may accommodate a carrier, such as a cassette or a front opening unified pod (FOUP), that receives the substrate S to be or has been processed. In the example embodiment, three load ports 110 are exemplarily illustrated, but the number and arrangement direction of the load ports 110 are not particularly limited.

The transfer frame 120 may be disposed between the load ports 110 and the transfer chamber 20 along the Y direction.

The transfer frame 120 may include therein a first transfer robot 130 being used to transfer the substrate S between the load port 110 and the processing section 40. The first transfer robot 130 may move on a transfer rail 132 installed and extending along the X direction to transfer the substrate S between the load ports 110 and the transfer chamber 20. For example, the first transfer robot 130 may exchange (transfer and pick up) the substrate S through a first opening 122 with a second transfer robot 230 disposed within the transfer chamber 20. The second transfer robot 230 will be discussed below in more detail.

In plan view, the transfer chamber 20 may have a polygonal shaped body having a chamber frame 220. For example, as shown in FIG. 1, the transfer chamber 20 may have a pentagonal body, and the EFEM 10 and the processing section 40 may be disposed along, for example, an edge of a circumference of the transfer chamber 20. In the example embodiment, the EFEM 10 and a plurality of process chambers 400a, 400b, 400c, and 400d may be placed along each edge of the circumference of the transfer chamber 20. The transfer chamber 20 may have a passages 222 on each sidewall of the chamber frame 220 thereof, and each of the passages 222 may spatially connect the transfer chamber 20 to each of the process chambers 400a, 400b, 400c, and 400d, respectively. Each passage 222 may be provided with a door configured to open or hermetically close the passage 222.

The transfer chamber 20 may be provided therein with a second transfer robot 230 which transfers the substrate S between the transfer frame 120 and the processing section 40. The second transfer robot 230 may provide the process chambers 400a, 400b, 400c, and 400d with the substrate S to be processed and on standby at the transfer frame 120, or may provide the transfer frame 120 with the substrate S which has been processed at the process chambers 400a, 400b, 400c, and 400d. In addition, the second transfer robot 230 may transfer the substrate S to the process chambers 400a, 400b, 400c, and 400d. For example, the second transfer robot 230 may transfer the substrate S between the process chambers 400a, 400b, 400c, and 400d, such that the substrate S may be sequentially introduced into the process chambers 400a, 400b, 400c, and 400d according to the processes to be performed on the substrate S. In the example embodiment, the transfer chamber 20 has a pentagonal shape, but embodiments are not limited thereto and the shape of the transfer chamber 20 may be selected depending on the design intent.

Figure 2:
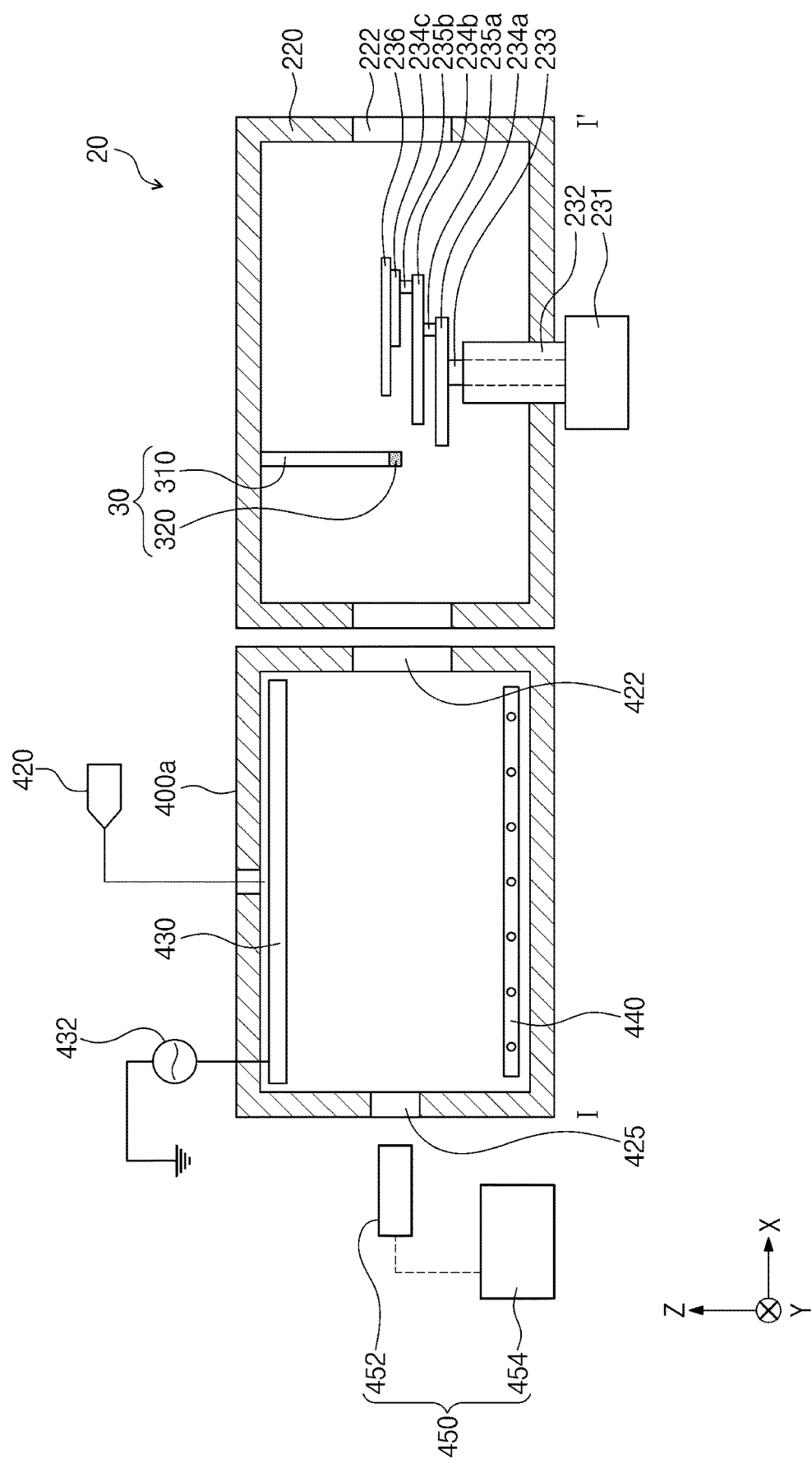
FIG. 2 illustrates a cross-sectional view taken along line I-I' of FIG. 1.

FIG. 2 illustrates a cross-sectional view taken along line I-I' of FIG. 1. Referring to FIGS. 1 and 2, the second transfer robot 230 may include a first driver 231, a first connector 232, a first supporter 233, first, second, and third rotational plates 234a, 234b, and 234c, first and second rotating shafts 235a and 235b, and a transfer hand 236. The first driver 231 may drive the second transfer robot 230. The first connector 232 and the first supporter 233 may connect and support the first driver 231 and the first rotational plate 234a. The first and second rotational plates 234a and 234b may be engaged respectively with the first and second rotating shafts 235a and 235b, and the third rotational plate 234c may be engaged with the transfer hand 236. When the first, second, and third rotational plates 234a, 234b, 234c rotate, the first and second rotating shafts 235a and 235b may change in their position (e.g., on an XY plane along the X and Y directions), and accordingly, the transfer hand 236 may move. The transfer hand 236 may transfer the substrate S between the transfer chamber 20 and the transfer frame 120 and between the transfer chamber 20 and the process chambers 400a, 400b, 400c, and 400d.

Referring to FIG. 2, the reference light source 30 may be provided within the transfer chamber 20. The reference light source 30 may provide a reference light (see RL of FIG. 4 or FIG. 5) to calibrate optical emission spectroscopy (OES) systems 450. The reference light source 30 may include a body 310 and a light source 320. The light source 320 may be a single light source. The body 310 may support the light source 320. The body 310 may be associated with one side of the transfer chamber 20. As shown in FIG. 2, the body 310 may have a rod-shaped structure extending downwardly from an upper wall of the transfer chamber 20, but this configuration is only illustrative and embodiments are not limited thereto. For example, the transfer chamber 20 may be provided on its inner wall with a guide rail extending along the circumference of the transfer chamber 20, and the guide rail may allow the body 310 to move or rotate along the circumference of the transfer chamber 20.

Figure 4:
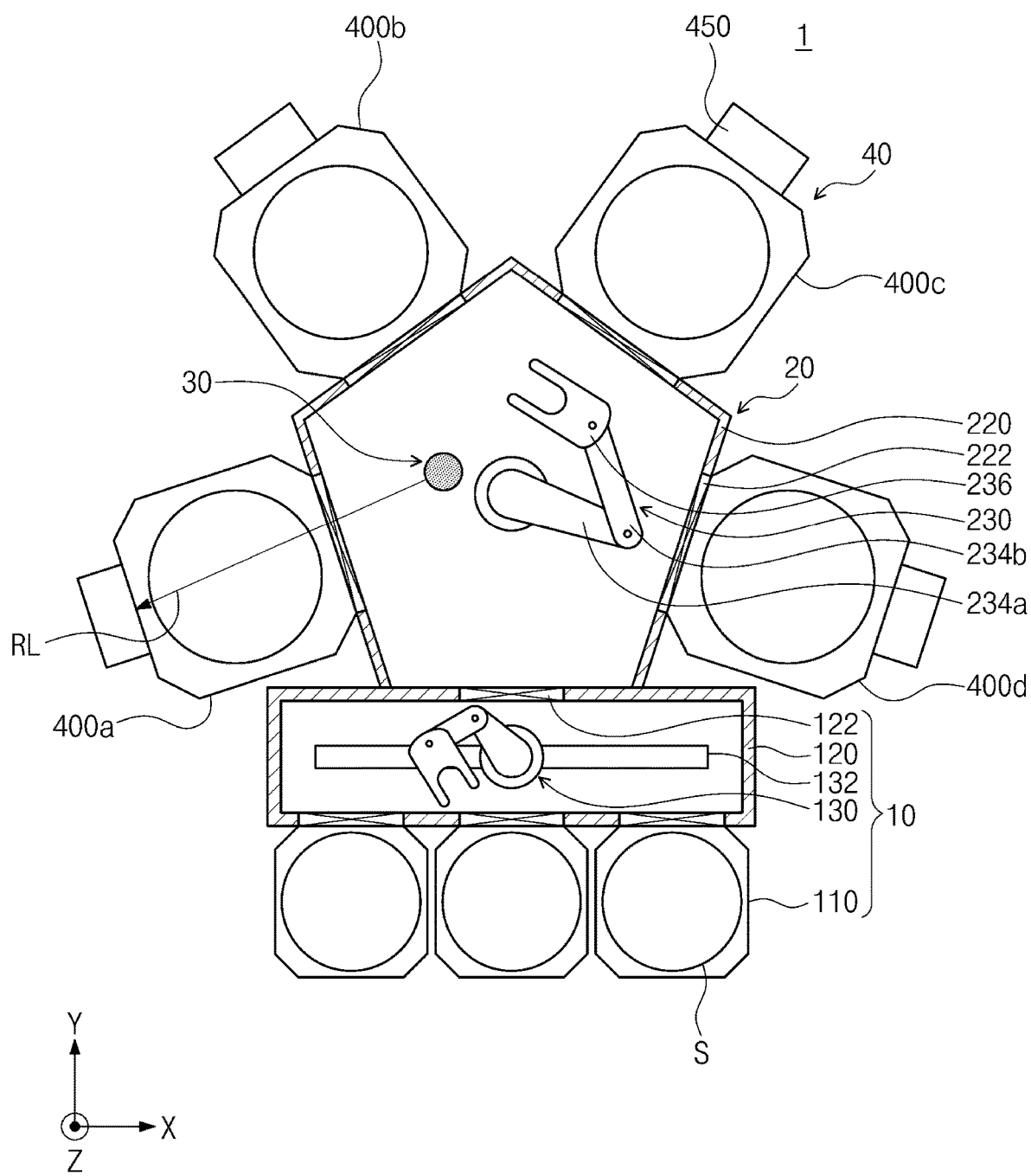
FIGS. 4 to 9 illustrate various diagrams and a substrate processing module to describe a semiconductor device fabrication method in accordance with the flow chart of FIG. 3.
Figure 5:
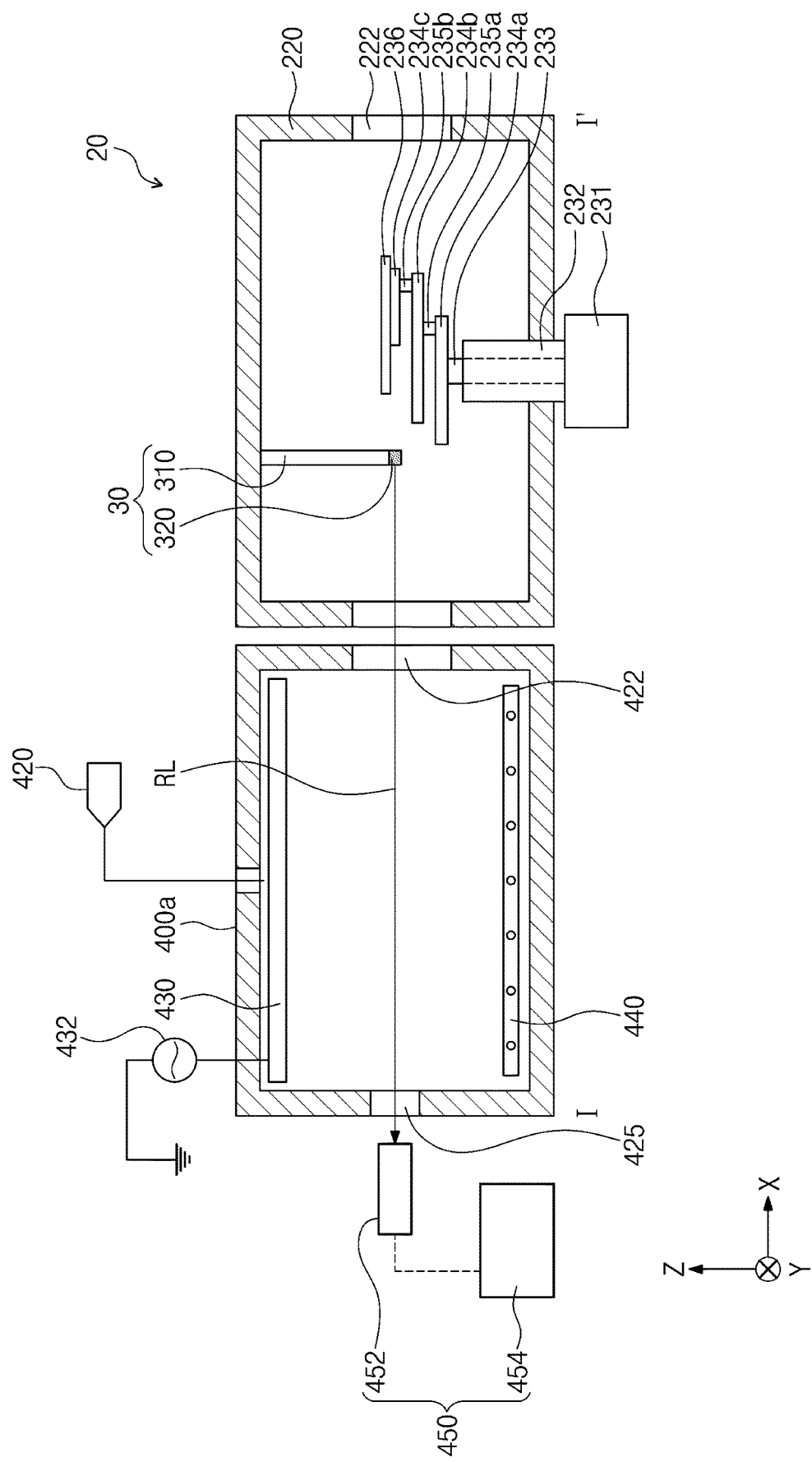

The light source 320 may emit the reference light RL (see FIG. 4 or FIG. 5). The light source 320 may be located at a predetermined height (e.g., a distance in the Z direction from the XY plane) corresponding to that of a window 425 and an optical receiver 452 that are discussed below. That is, the light source 320 may be located at a predetermined height so that the light source 320 may be detected in line-of-sight by the optical receiver through the window 425. The light source 320 may be, for example, a xenon (Xe) lamp. Alternatively, the light source 320 may be a multi-light source from which a variety of reference lights are released. For example, the light source 320 may emit a plurality of lights having different wavelength spectra.

The processing section 40 may include a plurality of process chambers 400a, 400b, 400c, and 400d. The substrate S may be processed within each of the process chambers 400a, 400b, 400c, and 400d. For example, the substrate S may undergo a plasma process within the process chambers 400a, 400b, 400c, and 400d. The plasma process may be, for example, an ashing process, an etching process, or a deposition process, but embodiments are not limited thereto. In the example embodiment, four process chambers 400a, 400b, 400c, and 400d are arranged in a clockwise direction along the circumference of the transfer chamber 20, but the number and arrangement of the process chambers are not limited thereto. The process chambers 400a, 400b, 400c, and 400d may be configured and shaped identically or similarly to one another, and the following will describe an example including a first process chamber 400a.

Referring to FIGS. 1 and 2, the first process chamber 400a may include a gas supply 420, a radio-frequency (RF) power supply 432, a showerhead 430, a stage 440, an OES system 450, and a controller. The first process chamber 400a may be a plasma apparatus, for example, a capacitively coupled plasma (CCP) apparatus, an inductively coupled plasma (ICP) apparatus, a microwave plasma apparatus, or any other plasma processing apparatus.

A semiconductor device may undergo a treatment process within the first process chamber 400a. For example, the first process chamber 400a may be configured to generate plasma to treat a semiconductor device. The first process chamber 400a may be provided in the form of a hermetic structure to maintain a vacuum state. In an example embodiment, the first process chamber 400a may include top and bottom chambers that are combined with each other, and may have a hollow hexahedral shape, a hollow cylindrical shape, or any other shapes.

A transfer pathway 422 may be provided on one side of the first process chamber 400a, and a window 425 may be provided on other side (i.e., the opposite side) of the first process chamber 400a. For example, the first process chamber 400a may be provided with the transfer pathway 422 on one lateral side adjacent to the transfer chamber 20, and provided with the window 425 on a lateral side opposite to the one lateral side. In the example embodiment, the transfer pathway 422 may face the passage 222. The transfer pathway 422 may provide an opening for the second transfer robot 230 to enter the first process chamber 400a.

The window 425 may be made of glass, quartz, or any other transparent materials through which light may pass. The window 425 may be transparent to infrared, ultraviolet, or visible light band. An opening provided with the window 425 may be hermetically sealed to maintain the first process chamber 400a in a vacuum state without introduction of impurities into the first process chamber 400a. The window 425 may not be limited to being disposed on the lateral side of the first process chamber 400a. For example, the window 425 may be disposed on a top side of the first process chamber 400a or on a gas exhaustion part of the first process chamber 400a. A deposition shield may further be included in the opening provided with the window 425. The window 425 may be provided in plural on the first process chamber 400a. The window 425 may be non-reflectively coated, and may have uniform transmittance depending on wavelengths.

The gas supply 420 may be installed on a side of the first process chamber 400a. In the example embodiment, the gas supply 420 may be installed on a top side of the first process chamber 400a, but the example embodiment is not limited thereto. The gas supply 420 may supply a process gas for treating a semiconductor device. For example, the process gas may include argon or any other gases selected based on objects and types of processes. The first process chamber 400a may be provided with a gas exhaustion part that discharges non-reacted source gases and byproducts resulting from semiconductor processing.

The showerhead 430 may be positioned within the first process chamber 400a. As shown in the example embodiment, the showerhead 430 may be disposed on an inner top side of the first process chamber 400a. The showerhead 430 may be disposed to face the stage 440. The showerhead 430 may uniformly spray process gases onto a semiconductor device provided on the stage 440. In addition, the showerhead 430 may serve as a top electrode. Hereinafter, the showerhead 430 may also be called a top electrode.

The RF power supply 432 may be provided to apply radio-frequency (RF) power for plasma generation or for plasma control. The RF power supply 432 may provide the top electrode 430 with the RF power. The RF power supply 432 may be provided in a form of a single power source or a plurality of power sources. Optionally, the RF power supply 432 may apply the RF power not only to the top electrode (or the showerhead) 430 but also to any other component. For example, when a bottom electrode is embedded in the stage 440, the RF power supply 432 may apply the RF power to the bottom electrode in the stage 440.

The stage 440 may be provided inside the first process chamber 400a to support a semiconductor device. The stage 440 may be disposed on an inner bottom side opposite to the inner top side of the first process chamber 400a. The stage 440 may be shaped like a flat plate. For example, the stage 440 may be equipped with an electrostatic chuck which utilizes electrostatic power to rigidly position a semiconductor device. The stage 440 may include a heater that heats a semiconductor device to a predetermined temperatures suitable for plasma treatment. The heater may be provided in the form of a hot wire embedded in the stage 440.

When the RF power supply 432 applies RF energy to the first process chamber 400a, the stage 440 and the top electrode 430 may retain an electric field caused by a difference in electric potential therebetween, with the result that plasma may be generated in the first process chamber 400a. The plasma formed on a semiconductor device may have a certain density that is changed based on a difference in electric potential between the stage 440 and the top electrode 430. The radio frequency of the RF power supply 432 may be controlled to adjust conditions of the plasma in the first process chamber 400a.

Figure 9:
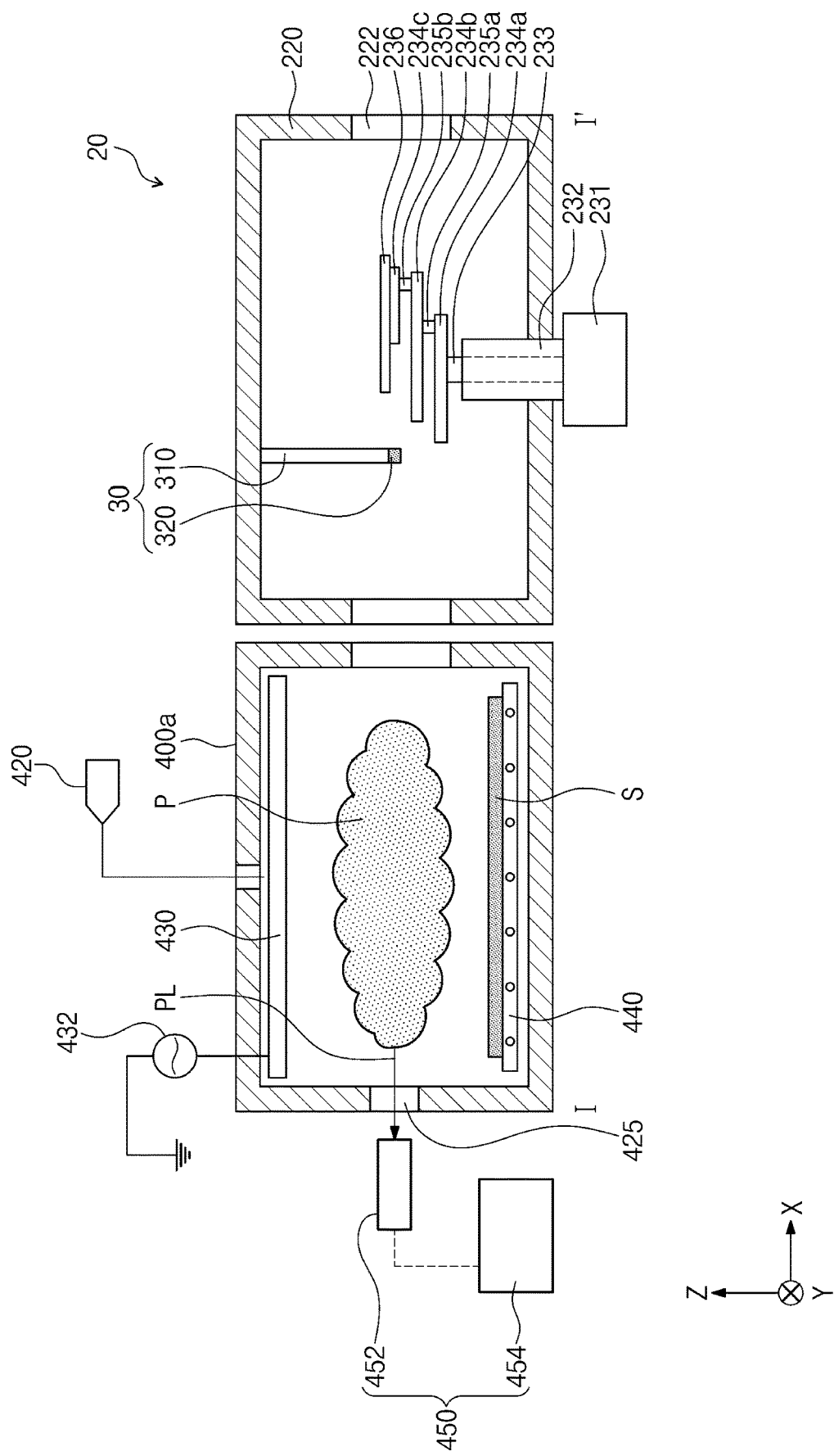

The OES system 450 may receive light (e.g., plasma light PL of FIG. 9) and analyze a spectrum of the received (plasma) light. The OES system 450 may include an optical receiver 452 and a processor 454. The optical receiver 452 may be disposed adjacent to the window 425. The optical receiver 452 may be, for example, an optic fiber. The optical receiver 452 may receive light (e.g., reference light or plasma light) emitted from the first process chamber 400a. The processor 454 may collect and analyze data on the light received by the optical receiver 452. For example, the processor 454 may be configured such that light released from the reaction between a semiconductor device and plasma (see P of FIG. 9) generated in the first process chamber 400a is converted into electrical signals, and the electrical signals are analyzed. The processor 454 may include a display. The OES system 450 may further include a collimator and the like.

The controller may control the overall operation of substrate processing module 1 including the EFEM 10, the transfer chamber 20, the reference light source 30, and the processing section 40. For example, the controller may control whether and when to transfer the substrate S, and may analyze and compare OES data collected from each of the process chambers 400a, 400b, 400c, and 400d.

Figure 3:
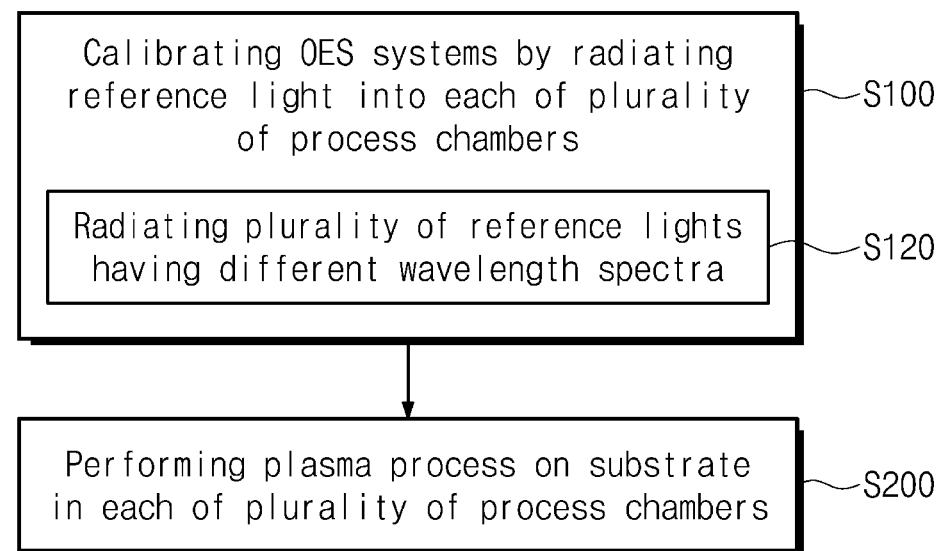
FIG. 3 illustrates a flow chart showing a semiconductor device fabrication method using a substrate processing module according to an example embodiment.

FIG. 3 illustrates a flow chart showing a semiconductor device fabrication method using the substrate processing module 1 according to an example embodiment. FIGS. 4 to 9 illustrate various diagrams and a substrate processing module 1 to describe a semiconductor device fabrication method in accordance with the flow chart of FIG. 3 according to an example embodiment. Referring to FIG. 3, the reference light RL may be radiated into each of the process chambers 400a, 400b, 400c, and 400d to calibrate the OES systems 450 provided on the process chambers 400a, 400b, 400c, and 400d (S100).

Referring to FIGS. 4 and 5, the reference light source 30 may radiate the reference light RL into the first process chamber 400a, and thus OES data may be obtained. The reference light RL may include a plurality of reference lights. For example, the reference light RL may include a plurality of lights having different wavelength spectra (S120). The reference light source 30 may include a first reference light source that emits a first reference light having a first wavelength band and a second reference light source that emits a second reference light having a second wavelength band. The second wavelength band may be a certain wavelength band within the first wavelength band. The first wavelength band of the first reference light may have a width less than that of the second wavelength band of the second reference light. The second wavelength band may correspond to a main wavelength band of a process gas supplied from the gas supply 420. The first reference light and the second reference light may be mixed with each other and incident at the same time to the optical receiver 452. That is, the first reference light and the second reference light are radiated simultaneously.

Figure 6:
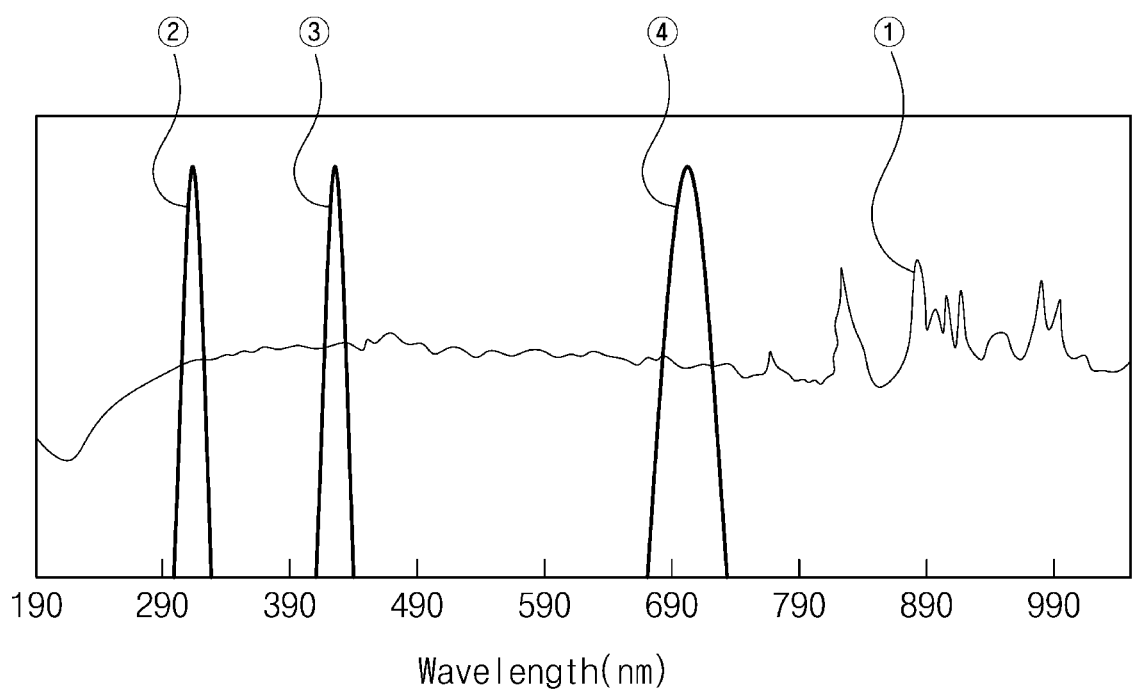

FIG. 6 illustrates a graph showing spectra of a reference light according to an example embodiment. Referring to FIG. 6, it may be ascertained that a total of four lights ①, ②, ③, and ④ are used as reference lights. For example, the light ① may be a first reference light (e.g., xenon (Xe)) with a wavelength band of about 190 nm to about 1000 nm, the light ② may be a second reference light with a wavelength band of about 300 nm to about 350 nm, the light ③ may be a third reference light with a wavelength band of about 400 nm to about 450 nm, and the light ④ may be a fourth reference light with a wavelength band of about 670 nm to about 750 nm. The wavelength band of each of the lights ②, ③, and ④ may be included in the wavelength band of the light ①, and the wavelength band of each of the lights ②, ③, and ④ may have a width less than that of the wavelength band of the light ①. When process gases applied to the first process chamber 400a emit lights with main wavelength bands of about 300 nm to about 350 nm, about 400 nm to about 450 nm, and about 670 nm to about 750 nm, the lights having such main wavelength bands may be additionally provided as reference lights. Accordingly, calibration may be performed to correct errors (e.g., peak broadening at a specific period or difference in peak broadening) between OES data obtained from the OES systems 450 under the same process condition. As a result, it may be possible to precisely calibrate the OES system 450 and to improve reliability of the OES system 450.

Figure 7:
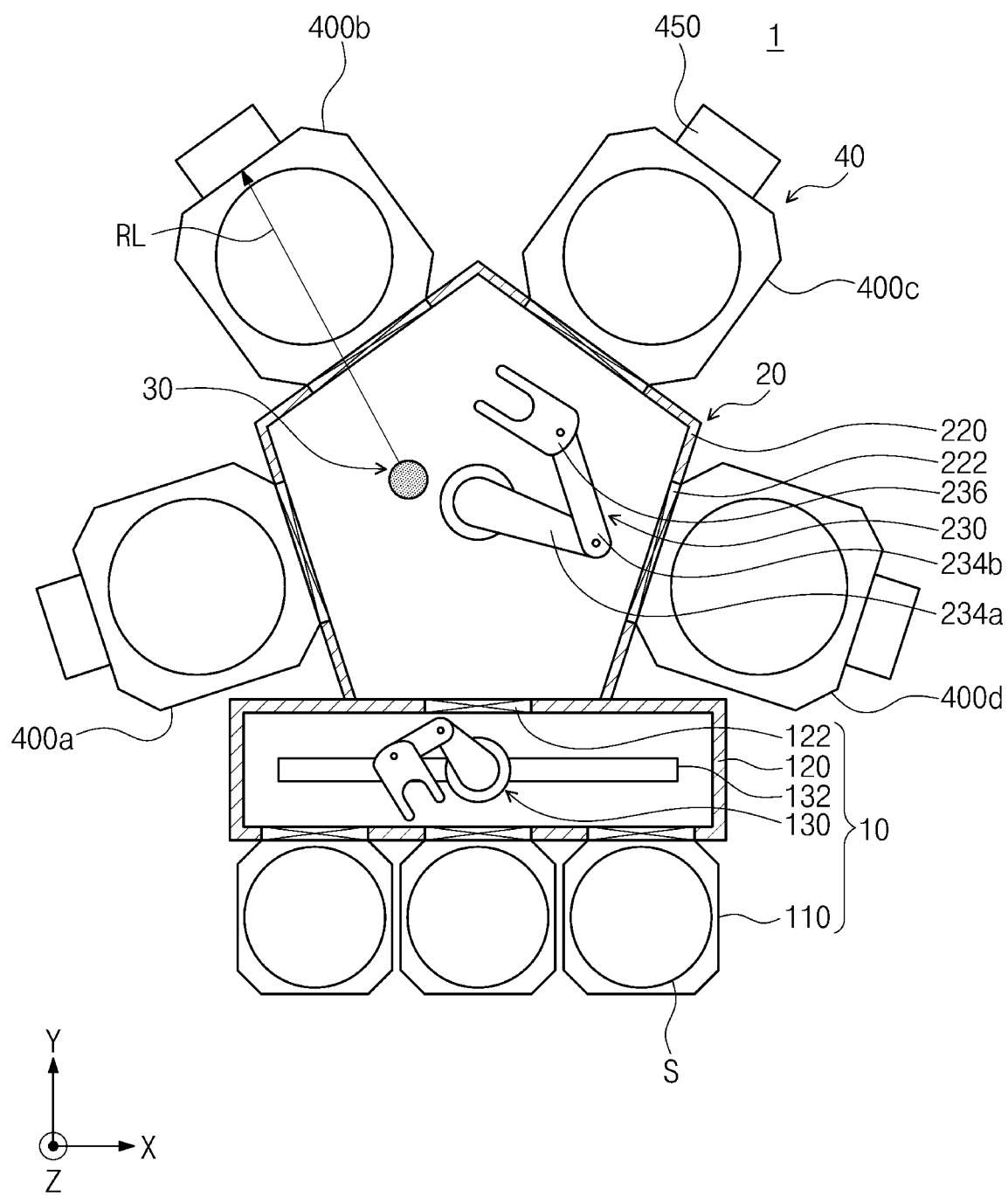
Figure 8:
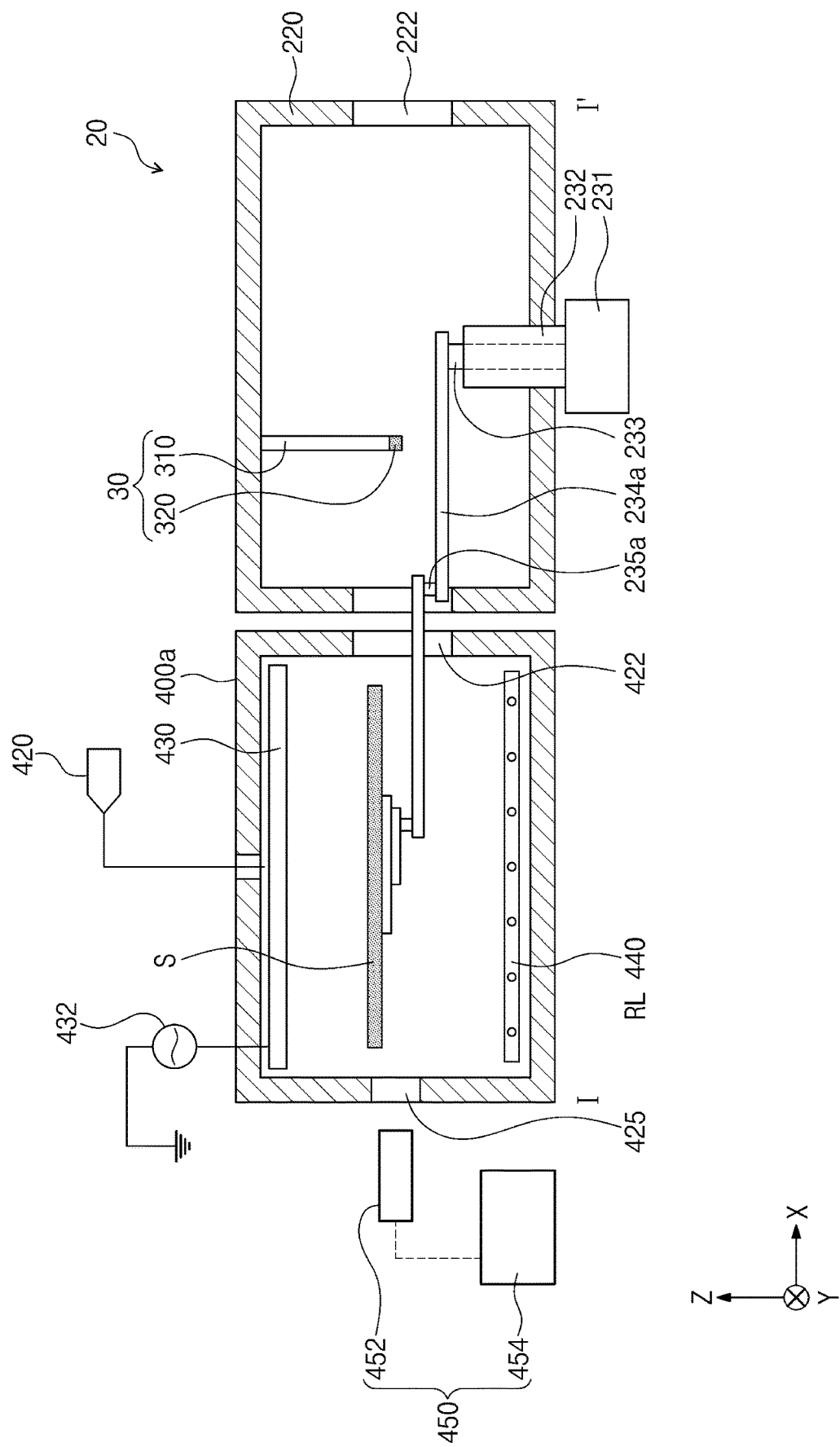

Referring to FIG. 7, the reference light source 30 may radiate the reference light RI, into a second process chamber 400b. The second process chamber 400b may receive the reference light RL and obtain OES data. The previous description regarding to the structure and shape of the first process chamber 400a are also identically or similarly applicable to the second process chamber 400b, and accordingly, redundant descriptions of the second process chamber 400b will be omitted.

Likewise, the reference light source 30 may successively radiate the reference light RL into the third and fourth process chambers 400c and 400d thereafter. Each of the third and fourth process chambers 400c and 400d may receive the reference light RL and obtain OES data.

The controller may gather and compare the OES data obtained by each of the process chambers 400a, 400b, 400c, and 400d to calibrate each of the OES systems 450 in the process chambers 400a, 400b, 400c, and 400d. For example, the OES data obtained by each of the process chambers 400a, 400b, 400c, and 400d may be gathered and compared to acquire one or more calibration factors. The calibration of the OES system 450 may include normalizing data obtained by a plurality of the OES systems 450. Because it is likely that the OES system 450 in each of the process chambers 400a, 400b, 400c, and 400d has the same data, the calibration of the OES system 450 may give the same effect as if zero adjustment is performed on each OES system 450 before a plasma process is carried out.

When the calibration of the OES system 450 is completed, each of the process chambers 400a, 400b, 400c, and 400d may perform a plasma process on the substrate S (S200). For example, referring to FIGS. 8 and 9, the second transfer robot 230 may transfer the substrate S to the first process chamber 400a, and then the first process chamber 400a may perform a plasma process on the substrate S. The plasma process may be one of an ashing process, an etching process, and a deposition process, but embodiments are not limited thereto. At this stage, the calibrated OES system 450 may receive a plasma light PL generated from the plasma and may monitor the first process chamber 400a. Before the first process chamber 400a receives the substrate S, the transfer chamber 20 may keep the substrate S in a standby state for a certain time.

In an example embodiment, the transfer chamber 20 may include therein the reference light source 30 to calibrate the OES systems 450 provided on a plurality of process chambers 400a, 400b, 400c, and 400d. Because the plurality of process chambers 400a, 400b, 400c, and 400d are arranged to share the transfer chamber 20, the reference light source 30 may be used to calibrate the OES systems 450, without need for placing the reference light source 30 in each of the process chambers 400a, 400b, 400c, and 400d. In addition, because the light source 320 is capable of using a multi-light source from which a plurality of reference lights are released, it may be possible to prevent deterioration of detection at a specific wavelength band and to improve reliability of inspection.

Figure 10A:
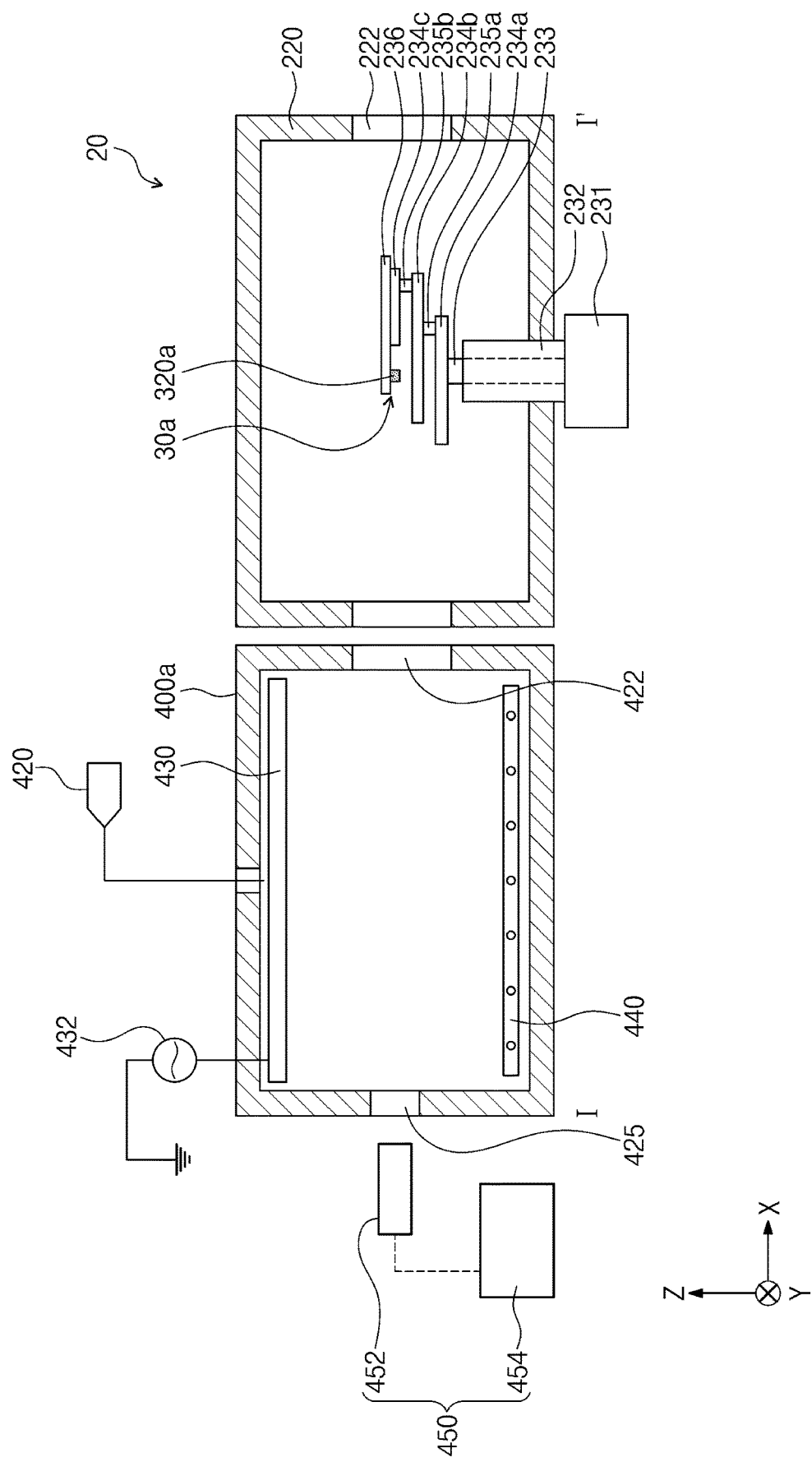
FIG. 10A illustrates a simplified diagram showing a reference light source according to an example embodiment.
Figure 10B:
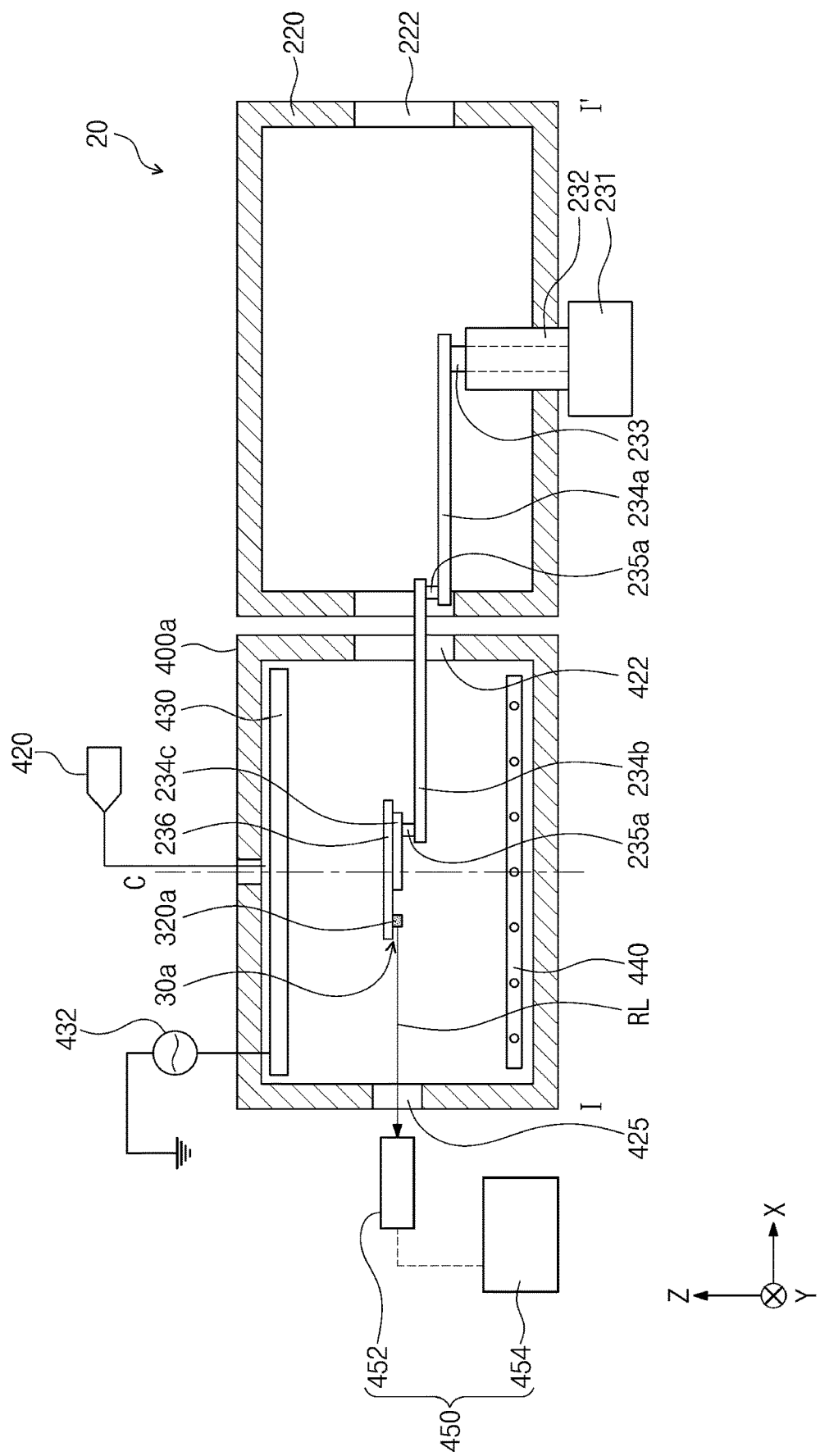
FIG. 10B illustrates a schematic diagram to describe an operation of the reference light source shown in FIG. 10A according to an example embodiment.

FIG. 10A illustrates a simplified diagram showing a reference light source 30a according to an example embodiment. FIG. 10B illustrates a schematic diagram to describe an operation of the reference light source 30a shown in FIG. 10A according to an example embodiment. Components substantially the same as or similar to those of the reference light source 30 discussed with reference to FIGS. 1 and 2 are allocated the same reference numerals, and repetitive descriptions thereof will be omitted in the interest of brevity.

Referring to FIG. 10A, the reference light source 30a may include a light source 320a provided on the second transfer robot 230. Specifically, the light source 320a may be associated or engaged with a transfer hand 236 of the second transfer robot 230. For example, the light source 320a may be disposed on a bottom side of the transfer hand 236 of the second transfer robot 230, but embodiments are not limited thereto.

Referring to FIG. 10B, to radiate the reference light RL, the transfer hand 236 of the second transfer robot 230 may be driven to enter the first process chamber 400a. For example, the transfer hand 236 may move between a first location within the transfer chamber 20 and a second location within the first process chamber 400a. The first location may be a standby position, and the second location may be a reference light radiation position. The second location may be placed beyond a central axis C of the first process chamber 400a and closer to the window 425 than to the transfer pathway 422. When the transfer hand 236 moves to reach the second location in the first process chamber 400a, the light source 320a may advance closer to the optical receiver 452 such that inspection reliability may be improved when receiving the reference light RL. In addition, the transfer hand 236 may be used to align the light source 320a with the window 425 (along a Z direction) regardless of the number and arrangement of the window 425. The mentioned second location is only illustrative, and thus the reference light RL may be radiated from the second transfer robot 230 at various locations within the first process chamber 400a. Moreover, an inspection process may be performed a plurality of times by placing the transfer hand 236 on various locations and radiating the reference light RL from each of the various locations.

Figure 11A:
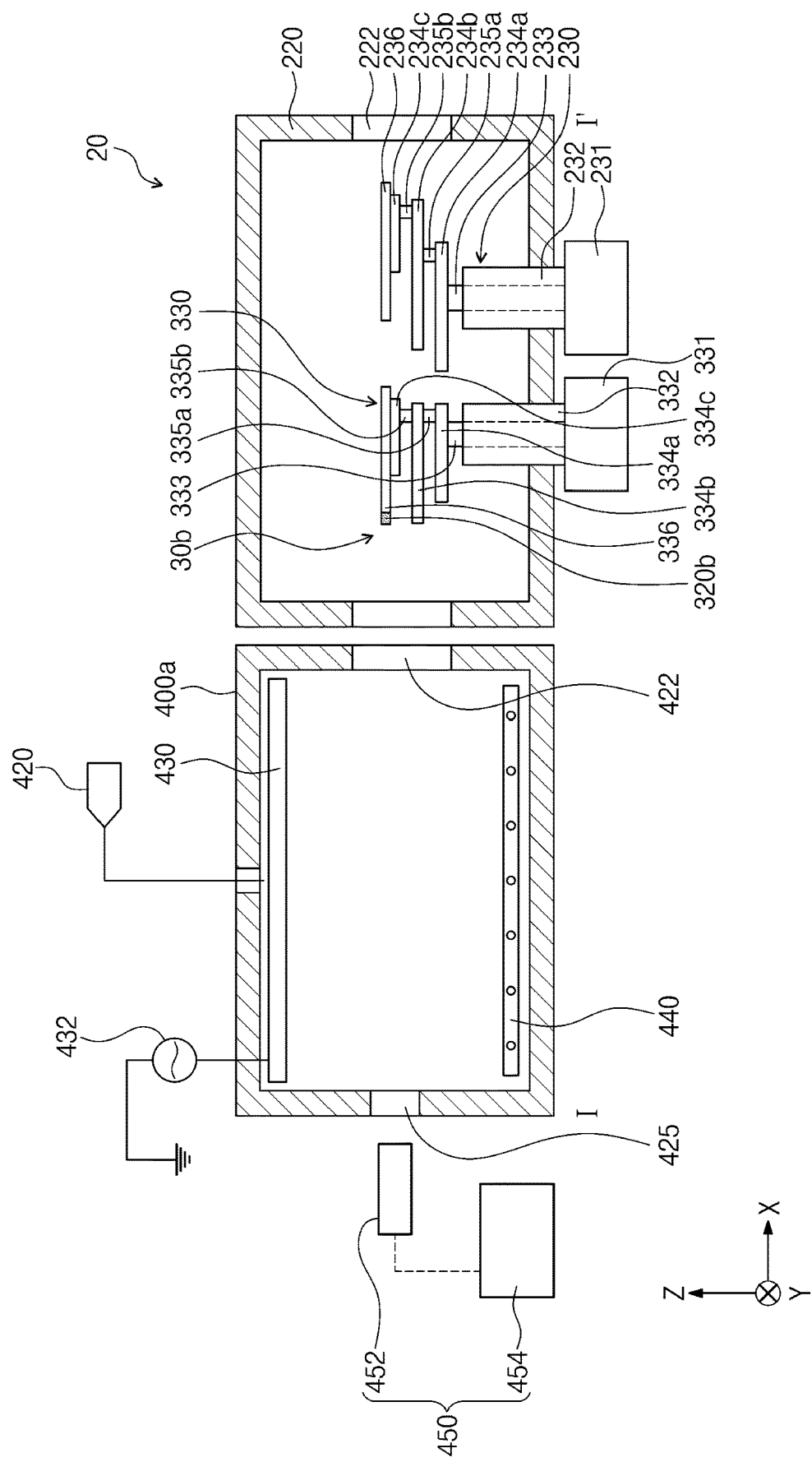
FIG. 11A illustrates a simplified diagram showing a reference light source according to another example embodiment.
Figure 11B:
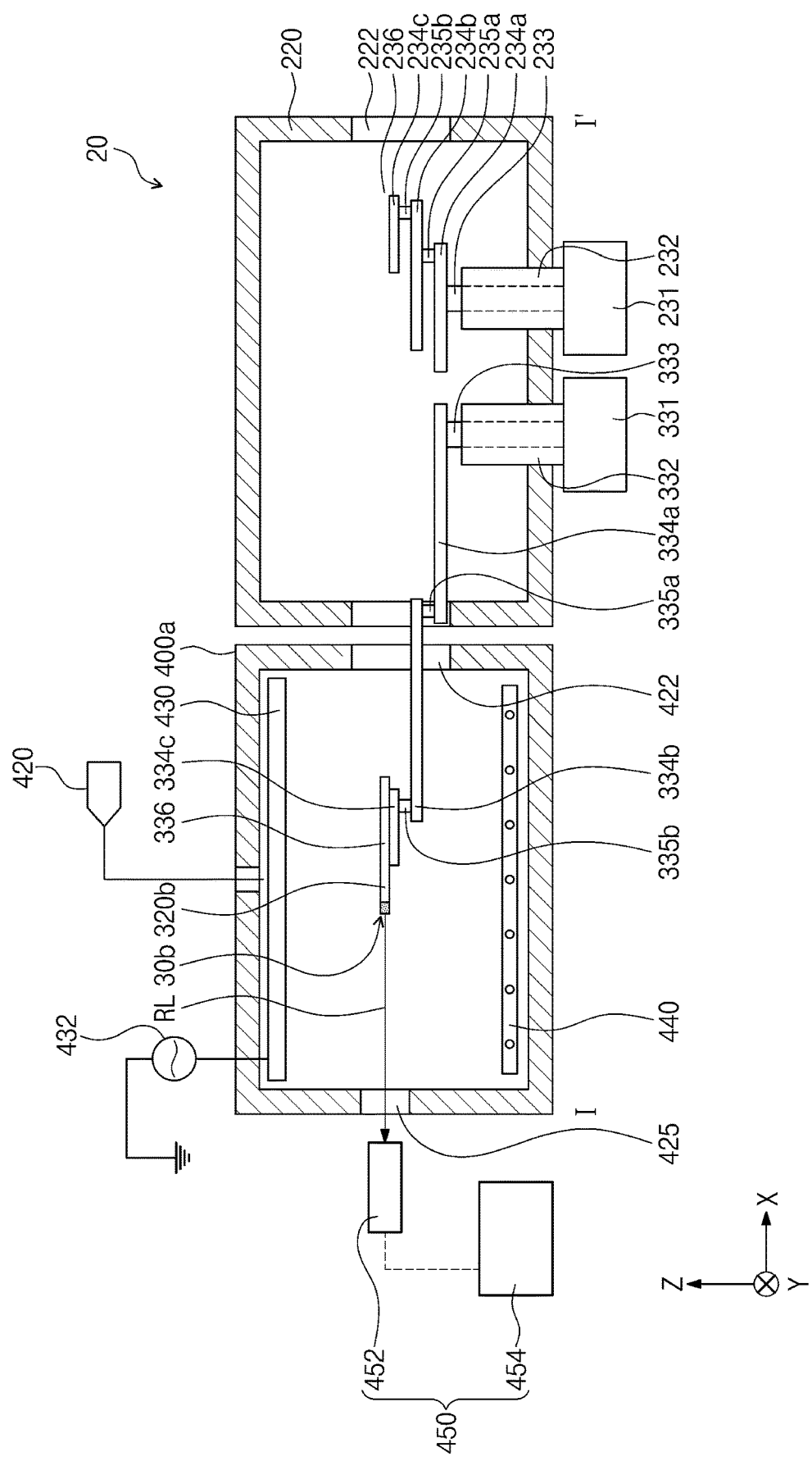
FIG. 11B illustrates a schematic diagram to describe an operation of the reference light source shown in FIG. 11A according to the example embodiment.

FIG. 11A illustrates a simplified diagram showing a reference light source 30b according to an example embodiment. FIG. 11B illustrates a schematic diagram to describe an operation of the reference light source 30b shown in FIG. 11A according to the example embodiment. Components substantially the same as or similar to those of the reference light source 30 discussed with reference to FIGS. 1 and 2 are allocated the same reference numerals, and repetitive descriptions thereof will be omitted in the interest of brevity.

Referring to FIG. 11A, the reference light source 30b may be associated with a calibration robot 330 disposed in the transfer chamber 20. The calibration robot 330 may include a second driver 331, a second connector 332, a second supporter 333, fourth, fifth, and sixth rotational plates 334a, 334b, and 334c, third and fourth rotating shafts 335a and 335b, and a calibration hand 336. The second driver 331 may drive the calibration robot 330. The second connector 332 and the second supporter 333 may connect and support the second driver 331 and the fourth rotational plate 334a. The fourth and fifth rotational plates 334a and 334b may be engaged respectively with the third and fourth rotating shafts 335a and 335b, and the sixth rotational plate 334c may be engaged with the calibration hand 336. When the fourth, fifth, and sixth rotational plates 334a, 334b, and 334c rotate, the third and fourth rotating shafts 335a and 335b may change in their respective position (e.g., on the XY plane), and accordingly, the calibration hand 336 may move. The calibration hand 336 may move between the transfer chamber 20 and the process chambers 400a, 400b, 400c, and 400d. The reference light source 30b may include a light source 320b provided on the calibration robot 330. The light source 320b may be associated or engaged with the calibration hand 336 of the calibration robot 330. For example, the light source 320b may be disposed on a side surface of the calibration hand 336 of the calibration robot 330, but embodiments are not limited thereto. For example, similar to the example embodiment shown in FIG. 10A, the light source 320b may be disposed on a bottom surface of the calibration hand 336 of the calibration robot 330.

Referring to FIG. 11B, to radiate the reference light RL, the calibration hand 336 of the calibration robot 330 may be controlled/driven to enter the first process chamber 400a. For example, the calibration hand 336 may move between a first location within the transfer chamber 20 and a second location within the first process chamber 400a. The first location may be a standby position, and the second location may be a reference light radiation position. As discussed with reference to FIG. 10B, the second location may be placed beyond the central axis C of the first process chamber 400a and closer to the window 425 than to the transfer pathway 422. When the calibration hand 336 moves to reach the second location in the first process chamber 400a, the light source 320b may advance closer to the optical receiver 452 such that inspection reliability may be improved when receiving the reference light RL. In addition, the calibration hand 336 may be used to align the light source 320b with the window 425 (along a Z direction) regardless of the number and arrangement of the window 425. The mentioned second location is only illustrative, and thus the reference light RL may be radiated from the calibration robot 330 at various locations within the first process chamber 400a. Moreover, an inspection process may be performed a plurality of times by placing the calibration hand 336 on various locations and radiating the reference light RL from each of the various locations.

According to some example embodiments, a transfer chamber may be equipped therein with a reference light source for calibrating OES systems provided on a plurality of process chambers. Because the plurality of process chambers are arranged to share the transfer chamber, the reference light source in the transfer chamber may be used to calibrate the OES systems without need for placing the reference light source in each of the process chambers. In addition, because the reference light source uses a multi-light source from which a variety of reference lights are released, it may be possible to prevent deterioration of detection at a specific wavelength band and to improve reliability of detection.

The effects are not limited to the aforementioned effects. Other effects, which are not mentioned above, will be apparently understood by one skilled in the art from the foregoing description and accompanying drawings.

Although example embodiments have been described, it will be understood by those skilled in the art that various changes and modifications may be made without departing from the technical spirit and essential feature of the present disclosure. Accordingly, all such modifications are intended to be included within the scope of the present disclosure as defined in the claims.

What is claimed is:

1. A semiconductor device fabrication method comprising:
calibrating an optical emission spectroscopy (OES) system provided on a process chamber, wherein the calibrating the OES system includes radiating a reference light from a reference light source onto the OES system;
keeping a substrate in a standby state in a transfer chamber provided on a first side of the process chamber,
providing the substrate into the process chamber; and
performing a plasma process on the substrate in the process chamber,
wherein the reference light source is provided in the transfer chamber.

2. The semiconductor device fabrication method of claim 1, wherein the radiating the reference light comprises:
radiating a first reference light having a first wavelength band; and
radiating a second reference light having a second wavelength band, the second wavelength band overlapping with at least a portion of the first wavelength band, and
wherein a second width of the second wavelength band is less than a first width of the first wavelength band.

3. The semiconductor device fabrication method of claim 2, wherein the performing the plasma process comprises supplying a process gas to the substrate, and
wherein the second wavelength band corresponds to a main wavelength band of the process gas.

4. The semiconductor device fabrication method of claim 2, wherein the first reference light and the second reference light are radiated simultaneously.

5. The semiconductor device fabrication method of claim 1, wherein calibrating the OES system comprises:
calibrating a plurality of OES systems provided on a plurality of process chambers; and
normalizing data obtained by each of the plurality of OES systems respectively provided on the plurality of process chambers.

* * * * *